United States Patent [19]

Soszek

[11] Patent Number: 4,698,907

[45] Date of Patent: Oct. 13, 1987

[54] METHOD FOR MANUFACTURING A CIRCUIT BOARD BY A DIRECT ELECTROSTATIC TRANSFER AND DEPOSITION PROCESS

[75] Inventor: Peter Soszek, Winnipeg, Canada

[73] Assignee: Somich Technology Inc., Winnipeg, Canada

[21] Appl. No.: 830,743

[22] Filed: Feb. 19, 1986

[30] Foreign Application Priority Data

Feb. 21, 1985 [GB] United Kingdom ............... 8504481

[51] Int. Cl.⁴ .......................................... H05K 3/10
[52] U.S. Cl. ............................. 29/846; 101/DIG. 13
[58] Field of Search ................. 29/846; 101/DIG. 13

[56] References Cited

U.S. PATENT DOCUMENTS

| | | | |
|---|---|---|---|
| 3,054,692 | 9/1962 | Newman et al. | 101/DIG. 13 |
| 3,108,893 | 10/1963 | Oliphant | 101/DIG. 13 |
| 3,120,806 | 2/1964 | Supernowicz | 29/846 X |
| 3,574,614 | 4/1971 | Carreira | 101/DIG. 13 |
| 3,828,670 | 8/1974 | Kennedy | 101/DIG. 13 X |
| 3,862,848 | 1/1975 | Marley | 101/DIG. 13 X |

Primary Examiner—Percy W. Echols
Assistant Examiner—Carl Arbes
Attorney, Agent, or Firm—Adrian D. Battison

[57] ABSTRACT

A process for the manufacture of circuitry in the form generally known as circuit boards comprises the manufacture of a master pattern from a conductive layer and a superposed non-conductive layer which can receive an electrical charge. The master pattern is contacted by a developer containing a conductive material in the form of powder or ink which transfers the conductive material to the pattern layers on the master pattern by electrostatic force. A non-conductive substrate is then brought to a position closely adjacent to the master pattern and electrostatic forces used to transfer the particles from the master pattern onto the substrate in the required pattern. The particles are then fixed by heating. Multiple layer circuits can be built up using nonconductive layers. A coating can be applied to the conductive particles to enable them to accept an electrostatic charge, the coating being dissipated during the heat fixing.

20 Claims, 11 Drawing Figures

OPPOSITELY CHARGED MATERIAL IN DEVELOPER BROUGHT CLOSE TO MASTER PATTERN

SUBSTRATE BROUGHT IN CLOSE PROXIMITY

1ST CIRCUITRY
LAYER APPLIED

1ST INSULATING
LAYER APPLIED

2ND CIRCUITRY
LAYER APPLIED

2ND INSULATING
LAYER APPLIED

3RD CIRCUITRY
LAYER APPLIED

METHOD FOR MANUFACTURING A CIRCUIT BOARD BY A DIRECT ELECTROSTATIC TRANSFER AND DEPOSITION PROCESS

BACKGROUND OF THE INVENTION

This invention relates to the manufacture of circuitry, for example, in the form generally known as printed circuit boards. Such boards are manufactured by a number of different techniques. The most common is that using a photographic printing and etching technique to leave a conductive network on a non-conductive layer. This however is a complex multi-step procedure which generates significant waste materials and does not allow ready redesign of the circuit to be produced.

One alternative is a technique using screen printing of an organic resin containing conductive ink and then curing and firing the ink. This again produces undesirable waste and also gives little flexibility for design changes.

It remains therefore a requirement for other processes which have advantages over the known techniques relating to reduced waste or increased flexibility.

SUMMARY OF THE INVENTION

According to the invention, therefore, it is provide a method for producing electrically conductive pattern on an electrically non-conductive surface layer comprising dispensing a material onto a master pattern, generating electrostatic forces between said surface layer and said pattern to transfer said material from said master pattern directly onto said surface layer so as to duplicate the master pattern on the surface layer and fixing said material on said surface layer, said material when dispensed onto said master pattern being capable of retaining an electrical charge applied thereto, and when fixed onto said surface being electrically conductive.

According to a second aspect of the invention there is provided an electrically conductive pattern on an electrically non-conductive surface when formed by a method according to the above definition.

This invention therefore provides a process for the manufacture of circuitry by an additive method using electrostatic deposition and transfer of a conductive layer to define the circuit pattern on a substrate. This process does not involve etching or cleaning. It uses a master pattern which may be simply produced with the possibility of variations to establish and accurately produce subsequent circuit patterns.

A conductive powder, or ink, is electrostatically deposited on the master circuit pattern. This master is then used to transfer the powder, or ink, by using electrostatic forces onto a non-conductive substrate.

The electrostatic deposition uniquely identifies the circuit board into circuitry and non-circuitry areas. The circuit board is now treated to fix the deposited powder, or ink, on the substrate. In the case of powders, this may involve high temperature "firing", and for inks a heat cure may be used. Furthermore, the circuitry may be treated to promote the bond, or adhesion, between it and the substrate. To improve electrical conductivity, solderability, etc., plating of the circuitry may occur.

Multi-layer circuit boards may be manufactured by using the above method. Alternating layers of conductive circuitry, insulating layers, and conductive interconnect pads may be electrostatically deposited from master patterns onto a substrate by using powders or inks which are either conductive or non-conductive as required. Finished circuit boards may be manufactured in this way to accommodate electronic devices (components) which are surface mounted. Drilling and through-hole plating would allow a combination of surface or through-hole mounted devices.

In addition, individual circuit boards consisting of a substrate and circuitry layer may be laminated using established methods and subsequently processed to create multi-layer circuit boards.

This technology can have advantages in reducing costs by providing for a high production rate of circuit boards. Extremely small circuit line widths are possible with this method providing an increase in both circuit density and the subsequent density of mounted electronic devices. Thus, this technology should be able to overcome many of the limitations involved in the manufacturing of circuitry by etching or screen printing techniques.

With the foregoing in view, and other advantages as will become apparent to those skilled in the art to which this invention relates as this specification proceeds, the invention is herein described by reference to the accompanying drawings forming a part hereof, which includes a description of the best mode known to the applicant and of the preferred typical embodiment of the principles of the present invention, in which:

Figure 1:
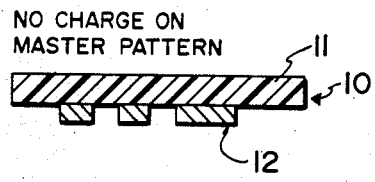
FIGS. 1 through 6 show schematically various process steps of a method according to invention.

The invention will become more apparent from the following description of examples referring when necessary to the drawings.

EXAMPLE 1 CONDUCTIVE DEPOSITION MATERIAL

Material Form

The conductive material may be in the form of a powder, liquid or ink.

Material Composition

There are numerous chemical elements and compounds which are conductive and from which the material can be chosen. Examples are: gold, silver, copper, indium, lead, tin, nickel, aluminum, antimony, arsenic, bismuth, cadmium, gallium, germanium, silicon, palladium, etc.

The powder may consist of the above in the form of extremely fine particles whose shape may be spherical, flake, completely irregular, regular, or a combination thereof.

Additionally, a thin non-conductive coating is present on the powder particles. Examples of suitable coatings are low temperature thermoplastics, epoxy resin, urea resin, alkyd resin, styrene polymers, etc.

The material must be capable of having an electrical charge induced on it. In order to obtain this characteristic with the conductive powder, a thin non-conducting coating, having special frictional electric or triboelectric properties is used to prevent a conduction or draining of charge from one particle to the next. This coating consists of a special plastic, resin, or other material. It is the intent that this non-conductive coating is broken down, burnt-off, or otherwise chemically removed after successful deposition of the conductive material into the desired circuit pattern. High temperature "firing" causes the thin non-conductive layer to be completely vaporized from the circuitry or migrate from between the conductive particles (allowing their fusion or bonding) and accumulate on the circuitry surfaces or edges as a deposit. Hence it may be removed chemically or by vigorous brushing.

The removal or control of the non-conductive coating by the above technique, is important so as not to affect the required conductive properties of the resulting circuitry.

Pertaining to the conductive material, the elements or compounds may be combined so that alloys are formed. These elements, compounds, and alloys have various melting points so that properties such as wettability can be selected. Increased wetting enhances bonding or fusion to the substrate or other base material. In addition, properties such as hardness, softness, and strength are variable by element and alloy type. The elements or compounds have varying electrical conductive properties and this can be used to allow for the fabrication of resistive circuitries in a controlled method.

In the case of liquids or inks, conductive particles are coated and/or suspended in the liquid or ink. The liquid should also provide the electrical properties needed as described above and have other rheological properties tailored to the process.

The conductive material may be required to be non-magnetic in nature so that it may be used in certain developers to be described herein.

Application Characteristics

The above conductive material initially resides in what could be termed a "developer". The function of the developer is to hold a reserve/supply of conductive material and induce an electric charge on it. Thus, one of the primary application characteristics is that the conductive material should accept and hold an electric charge for a sufficient period of time, that is the period of time required to attach itself to the master pattern and allow a transfer to the substrate.

The master pattern is a precise and accurate layout of the intended circuitry areas. These circuit areas then receive an electric charge which is opposite to that applied to the conductive material in the developer.

The developer brings the charged conductive material in close proximity to the oppositely charged areas of the master pattern. Due to the stronger charge on the circuit areas of the master pattern it attracts and uses electrostatic forces to pull the oppositely charged conductive material from the developer.

The master pattern is then brought in extremely close proximity to the substrate material such that they are virtually touching. A yet stronger electric charge, still opposite to that on the conductive material, is applied from under the substrate material and pulls the conductive material onto it.

Due to the close proximity of the pattern to the substrate an extremely accurate and precise transfer is possible. Also, because of the method of transfer, with no wearing contact, the life of the pattern should be virtually indefinite even with high usage.

Not only are small circuit line widths possible with this technique, but their thickness is controllable to allow for very fine depositions, or films, to be transferred.

For example, by controlling the amount of electric charge placed on the intended circuitry areas of the master pattern this would dictate the resultant electrostatic force applied on charged material in the developer and hence how much is "pulled" out.

FIGS. 1 through 6 illustrate the sequence of events.

FIG. 1 shows the master pattern indicated generally at 10 including a base layer 11 and a pattern layer 12.

Figure 2:
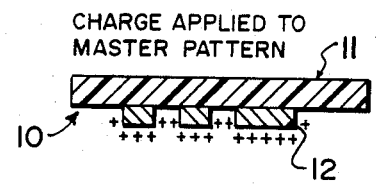

In FIG. 2 a charge is applied to the master pattern by conventional techniques so that electrostatic charge is present on the non-conductive pattern layer 12.

Figure 3:
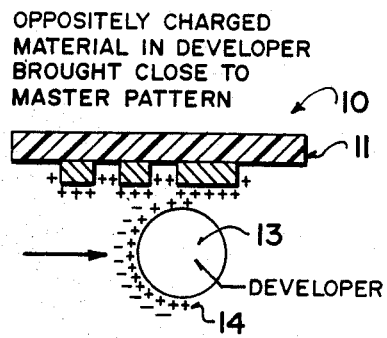

In FIG. 3 a developer is brought to the master pattern 10, the developer comprising a plurality of balls 13 carrying powder particles 14. The powder particles are the type described hereinafter.

Figure 4:
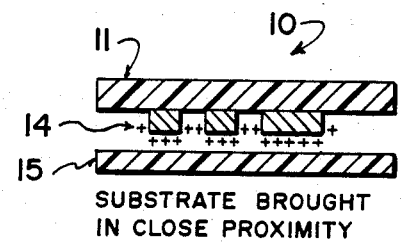

In FIG. 4 the powder particles are attached to the master pattern 10 and a substrate 15 is brought in close proximity to the master pattern.

Figure 5:
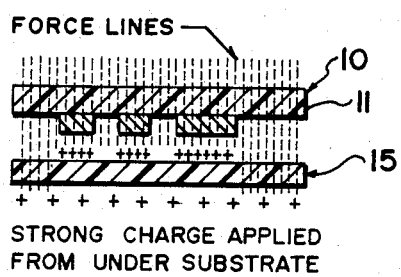

In FIG. 5 a strong electrostatic charge is applied to the substrate to cause the charged particles to transfer from the pattern layer to the substrate 15.

Figure 6:
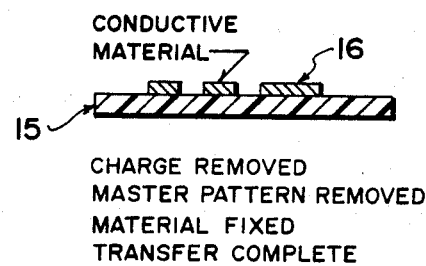

In FIG. 6 the substrate and particles are removed from the master pattern and fixed, as explained hereinafter to permanently attach the particles to the substrate 15 in the form of a conductive pattern 16.

EXAMPLE 2 NON-CONDUCTIVE DEPOSITION MATERIAL

Material Form

The non-conductive material may be in the form of a powder, liquid or ink.

Material Composition

There are numerous chemical elements and compounds which are non-conductive or considered to have insulating properties which are sufficient to allow the functioning of electric or electronic circuits as they are intended to be used.

Compositions may include some or a combination of the following: epoxy and acrylic resins, polymers, ceramics, glass, glass-like materials, etc.

Powders may consist of the above in the form of extremely fine particles whose shape may be spherical, flake, completely irregular, regular, or a combination thereof.

In the case of liquids or inks, the non-conductive or insulating materials would be coated and/or suspended in the liquid or ink. The liquid or ink may have specific rheological properties tailored to the process.

Being non-conductive or insulating, problems will not exist where the particles will conduct or drain away electric charges. This would be the case regardless of whether the form of the material is a powder, liquid or ink.

The material must be capable of having an electric charge induced on it. The non-conductive material may be required to be non-magnetic in nature so that it may be used in certain developers (to be described later)

Various physical characteristics such as coefficients of thermal expansion, strength properties, etc., may have to be compatible with the conductive material to allow for a reliable use of the end product or other successful usage within this technology.

Application Characteristics

The same application characteristics as described in Example 1 apply except that instead of conductive material being used it is non-conductive or insulating material. The master pattern is of course different and describes the layout of where insulating areas are intended, instead of circuitry.

Figure 7:
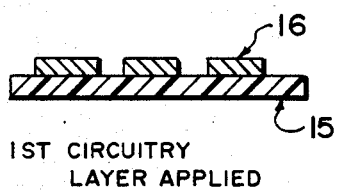
FIGS. 7 through 11 show schematically a process employing the invention and subsequent to the steps of FIGS. 1 through 6 for creating a multiple layer circuit.
Figure 8:
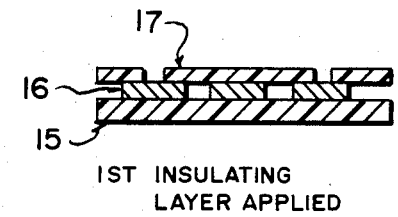
Figure 9:
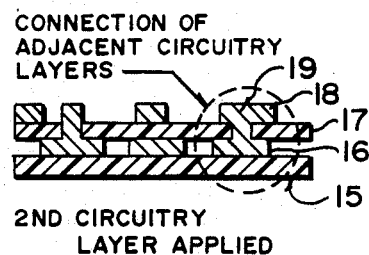
Figure 10:
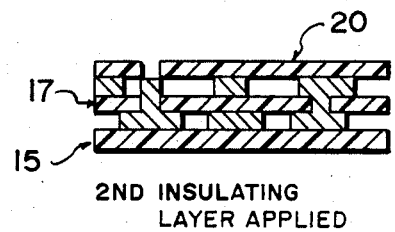
Figure 11:
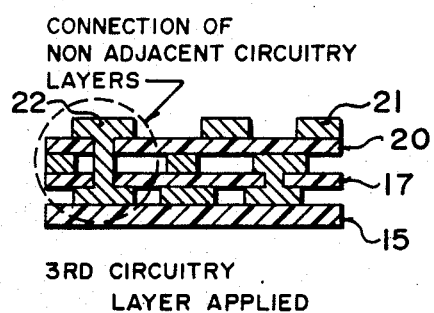

The primary use of a non-conductive deposition material is in the creation of multi-layer circuits. After a layer of circuitry has been transferred and then treated to fix it to the substrate, a layer of non-conducting material is deposited on top using the same basic principle and process. Subsequently, yet another layer of circuitry can be applied.

Where interconnections between circuit layers are required, voids or pads, exist in the non-conductive layer as determined by its particular master pattern. These voids are later filled by conductive material from the next process application. In this way electrical interconnections can be created between adjacent and even non-adjacent circuitry layers. FIG. 7 shows a first layer of circuitry comprising the pattern 16 and the substrate 15. In FIG. 8 a first insulating layer 17 is applied on top of the pattern 16 by the above technique. In FIG. 9 a further layer of circuitry is applied as indicated at 18 and showing an interconnection between adjacent circuitry layers at 19. In FIG. 10 a second insulating layer is applied as shown at 20 with a third conductive layer indicated at 21 in FIG. 11. A connection between two non-adjacent circuitry layers is indicated at 22.

The aforementioned description and illustration is but one method of creating multi-layer circuitry which is particularly suited to this technology. However, other methods of manufacturing layer circuits are well understood as an art.

EXAMPLE 3 SUBSTRATE MATERIAL

Material Form

The substrate can be in the form of a rigid sheet, or a flexible film.

Material Composition

The substrate may be selected from the group consisting of thermoplastic and inorganic dielectric materials and more particularly from the group consisting of polyethylene, polysulfone, polycarbonate, polyimide, alumina, silica and beryllia.

Material Characteristics

The following characteristics are considered important as relating to this technology.

The substrate is to support the circuitry and maintain electrical isolation of circuit paths as required. In the case of certain multi-layer applications the substrate provides the support for all the layers.

The substrate provides the strength and dimensional stability for the applied layer(s), their fixing, or for subsequent use of the completed circuit board within a product.

The substrate is prepared or chosen so that there is a good match of its characteristics with that of the conductive or insulating material in terms of wetting and/or bonding during a fixing process. The substrate accommodates fixing and/or subsequent processes without undue loss of required characteristics.

As the conductive or insulating material is transferred by electrostatic forces applied through the substrate, the substrate should behave as an isotropic homogeneous material, that is, exhibiting properties with the same values when measured along axes in all directions; and being of uniform structure throughout.

EXAMPLE 4 THE DEVELOPER

The purpose of the developer is to transfer a reserve/supply of conductive or insulating material onto the appropriate master pattern, which previously has had an electric charge applied to its pattern areas. Developers of various types exist in xerographic processes and are understood. The following is a general description of just one style of developer which is applicable to this technology.

This developer is particularly suited where the conductive and insulating material is in the form of a powder. Other material forms such as liquids or inks may require different techniques not specifically described, but known to one skilled in the art. As well, separate developers may be used for different powder material compositions.

The developer consists of a rotating magnetic cylindrical drum (not shown). A reserve area contains a supply of extremely small steel and quartz balls provided with a coating of special plastic. A second reserve holds either conductive or insulating material, and dispenses controlled and variable quantities of this powder, from above, and into the first reserve mixture.

A set of continuous buckets is driven through the first reserve mixture, picking up quantities of the mixture and then dumping or cascading it onto the rotating magnetic cylindrical drum. The first reserve may also contain a long screw-like mixing shaft. As soon as this mixture is set in motion, the balls and powder induce electric charges on each other. The powder particles at first adhere to the carrier balls, which are slightly larger in size.

As the mixture is cascaded over the rotating magnetic drum, the steel balls carrying powder, affix themselves to the cylindrical drum due to magnetic attraction/forces. The entire drum surface is covered in finger-like projections of balls and powder, much like iron filings on a magnet. If the drum has uniform magnetic properties the height of the finger-like projections will be constant and uniform looking much like a magnetic brush.

The master pattern has already had its particular pattern areas charged oppositely to the charge on the powder in the developer. The rotating drum, or magnetic brush, is passed in close proximity to the pattern. Powder particles are pulled and attach themselves to the oppositely charged pattern areas. Powder particles do not adhere to the uncharged non-pattern areas. The carrier balls remain affixed to the drum as the magnetic forces are greater than any electrostatic forces involved.

For this example, the powder material composition should of course be non-magnetic.

EXAMPLE 5 THE MASTER PATTERN

Three methods of creating a master pattern will be described as they are intended for use within the process of this technology. However, other methods exist to create a master pattern in rigid, flexible, or, thin foil-like form.

Method 1

This method was first established in the xerographic field for copying and duplicating of printed matter. It is well understood. A photoconductive semi-conductor material is used such as selenium, selenium/arsenic or selenium/tellurium, and which conducts electricity on exposure to light but behaves as an insulator in the dark. This material is applied in layers to a conducting plate. The semi-conductor is electrostatically charged in the dark and then a design projected on it. In the illuminated areas the electric charge is dissipated, but the unilluminated areas of the material retains a residual charge which can now be developed.

Improvements are required in this method to overcome certain disadvantages, as follows.

This type of master pattern lends itself to duplicating designs where only a few copies may be needed and where the design may change frequently. i.e. traditional photocopying requirements. In the case of circuit boards where high volumes may be manufactured a more permanent type of pattern is required.

Projecting a design onto the pattern also involved lenses and mirrors which can create distortions in the projected design when compared to the original. Circuit boards require a high degree of accuracy in comparison to its original design. As well, the photoconductive semi-conductor material may be wrapped on a cylindrical drum, further adding to problems of distortion when transferring patterns onto flat substrates.

The same photoconductive materials, described in Method 1, can be used by applying them to a very flat metal plate which serves as its base. Since the substrate can also be held to a high degree of flatness precise and accurate transfers of conductive or insulating material can be achieved.

The desired pattern to be transferred need not necessarily be projected onto the photoconductive surface. Instead, laser irradiation can be used to directly write and create the pattern. This may have advantages in that the actual pattern can be "burnt-in" by an excessive laser intensity, and not require a periodic refreshing of the pattern as any electric charges are drained or dissipated away.

Method 2

U.S. Pat. No. 4,266,006 describes a process for the manufacture of imaged articles. Examples are given where an aluminum plate is coated with a layer and irradiated with laser light. Non-irradiated areas of the layer are removed. By focusing the laser beam with an objective, focal points of less than 50 micrometers may be produced on the layers.

The layers are non-photosensitive so that irradiation can be carried out in daylight. The composition of the layer can be selected from the group consisting of melamine resin, urea resin, alkyd resin, phenolic resin, epoxy resin, acetal resin, polyamide, and styrene polymer.

This method has advantages in that a more permanent type of master pattern is created in that no refreshing by irradiation or other means is required to re-establish the pattern. This is an advantage over the pattern type described in Method 1. In addition, all aspects described in this technology can be carried out in daylight.

Due to the non-conductive nature of the layer material, electric charges can be induced on it. Thus all development and transfer methods previously described may be completed.

Method 3

My copending U.S. application Ser. No. 739,192 describes a method whereby a conductive or non-conductive powder, paste, film or liquid is uniformly deposited on a substrate and irradiated, possibly by a laser, to directly write a desired pattern.

The above method can be made applicable to this technology by utilizing non-conductive powders, pastes, etc., and irradiating them on a metal base material instead of on a substrate. This will allow for the induction of electric charges only on the pattern areas and then a development and transfer can take place.

SUMMARY OF THE BASIC PROCESS

This technology has described a process which uses a master pattern to define all subsequent reproductions for manufacturing a circuit board. The master pattern has a non-conductive pattern layer which is capable of having an electric charge induced on it. This layer may also be semi-conductive.

A developer is used to induce electric charges on conductive, or non-conductive material contained within it. The developer then applies the conductive, or non-conductive, material to the master pattern. The material is deposited on the pattern areas due to electrostatic forces.

The master pattern is brought in close proximity to a substrate and an electric charge is applied from underneath the substrate. Again, due to the electrostatic forces the conductive, or nonconductive, material is pulled onto the substrate providing for an accurate and precise reproduction of the master pattern.

The substrate and transferred material is then treated to affix the material to the substrate. If required, the substrate and its conductive or non-conductive layer can be re-processed to apply additional layers.

To ensure accurate and precise pattern reproduction an extremely flat metal base is envisioned for the master pattern. The developer and its magnetic brush can move under and deposit conductive or non-conductive material.

Various forms and types of substrates may be used. To allow an accurate transfer an extremely flat metal plate containing numerous small and closely spaced holes can be connected to a manifold and high vacuum applied to hold down the substrate material to achieve a high degree of flatness. Thin film substrates can be processed in this way.

Induction of electric charges on the master pattern and transfer to the substrate may be achieved by applying high voltages. Electric charges and forces may be created by single fine wires or a parallel grid of wires displaying a high voltage corona. Control over the voltage levels may provide control over the transfer process, as the electrostatic force is a function of the voltage potentials.

Various methods exist to fix a transferred material onto its substrate. In the case of powders, a high temperature "firing" may be used. Certain metals such as copper may require the firing to occur in an inert gas such as Nitrogen.

To realize full metallic conductivity the metallic particles should be melted together. While this is possible, using ceramic substrates, it is more difficult on glass-epoxy boards which are the mainstay of the printed circuit board industry.

The use of conducted heat or selected wavelength radiation can address these difficulties by selectively applying greater heating to the conductive pattern than to the substrate. A powder containing an infrared absorbing material, for use with an infrared heating source, or a powder with a large loss-angle at microwave frequencies for use with a microwave source are but two examples.

There are numerous combinations of mechanical methods, movements and apparatus that could be employed to implement this technology. Some may address methods to obtain high degrees of registration for the precise alignment of one applied layer onto the next.

This technology is additive in nature. It eliminates many of the process variables used during traditional circuit board manufacture using print and etch techniques. Problems with chemical solutions and cleaning can be avoided providing savings in cost. Higher precision, accuracy, design automation, and circuit densities in the manufacturing of circuit boards may be possible.

Since various modifications can be made in my invention as hereinabove described, and many apparently widely different embodiments of same made within the spirit and scope of the claims without departing from such spirit and scope, it is intended that all matter contained in the accompanying specification shall be interpreted as illustrative only and not in a limiting sense.

What is claimed is:

1. A method for producing an electrically conductive pattern on an electrically non-conductive surface layer comprising dispensing a powder material onto a master pattern, generating electrostatic forces between said surface layer and said master pattern to transfer said powder material from said master pattern directly onto said surface layer so as to duplicate the master pattern on the surface layer and fixing said material on said surface layer, said powder material consisting of a non-magnetic conductive material which when fixed onto said surface, forms a suitable electrical conductor, and which is modified when dispensing onto said master pattern to be capable of retaining an electrical charge applied thereto.

2. The invention according to claim 1 wherein the material is in the form of powder particles with a coating on said powder particles which coating is arranged to increase the acceptance by said particles of electrostatic charges when dispensed and is deactivated by said fixing.

3. The invention according to claim 2 wherein said coating is deactivated by being removed.

4. The invention according to claim 2 wherein the coating is non-conductive.

5. The invention according to claim 2 wherein the coating is triboelectric.

6. The invention according to claim 1 wherein the material is in liquid form.

7. The invention according to claim 1 wherein said fixing is carried out by high temperature heating.

8. The invention according to claim 7 wherein said heating is provided by a heat source and wherein the heat source, material and surface layer are arranged such that the material has a higher absorption of heat from said source than does said surface layer.

9. The invention according to claim 8 wherein said heat source comprises a source of infra-red energy and wherein said material contains an infra-red absorbing additive.

10. The invention according to claim 8 wherein said heat source comprises a source of microwave energy and wherein said material has a large loss-angle at microwave frequencies.

11. The invention according to claim 1 wherein said master pattern has a photoconductive layer.

12. The invention according to claim 11 wherein said photoconductive layer is radiated by laser light to create the desired pattern for generation of said electrostatic forces.

13. The invention according to claim 1 wherein said master pattern comprises a carrier of an electrically conductive material having on a surface thereof a pattern layer of electrically non-conductive material on which an electrostatic charge can be induced.

14. The invention according to claim 13 wherein said pattern layer is formed on said carrier by radiation thereof with a laser.

15. The invention according to claim 13 wherein said pattern layer material is selected from the group consisting of melamine resin, urea resin, alkyd resin, phenolic resin, epoxy resin, acetal resin, polyamide, and styrene polymer.

16. The invention according to claim 1 wherein said electrically non-conductive surface layer is chosen from the group consisting of thermo plastic and inorganic dielectric materials.

17. The invention according to claim 1 wherein said electrically non-conductive surface layer is chosen from the group consisting of polyethylene, polysulfone, polycarbonate, polyimide, alumina, silica and beryllia.

18. A method for producing an electrically conductive pattern on an electrically non-conductive surface layer comprising dispensing a powder material onto a master pattern, generating electrostatic forces between said surface layer and said master pattern to transfer said powder material from said master pattern directly onto said surface layer so as to duplicate the master pattern on the surface layer and fixing said material on said surface layer, said powder material consisting of a conductive material which when fixed onto said surface, forms a suitable electrical conductor, and which is modified when dispensing onto said master pattern to be capable of retaining an electrical charge applied thereto, including the steps of dispensing onto a second master pattern a second powder material of the type that when dispensed onto said second master pattern is capable of retaining an electrical charge applied thereto and when fixed onto said surface is electrically non-conductive, generating electrostatic forces between said surface layer having thereon said fixed powder material and said second master pattern to transfer said second powder material from said second master pattern directly onto said surface layer and fixing said second powder material on said layer to form a non-conductive layer.

19. A method for producing an electrically conductive pattern on an electrically non-conductive surface layer comprising dispensing a powder material onto a master pattern, generating electrostatic forces between said surface layer and said master pattern to transfer said powder material from said master pattern directly onto said surface layer so as to duplicate the master pattern on the surface layer and fixing said material on said surface layer, said powder material consisting of a conductive material which when fixed onto said surface, forms a suitable electrical conductor, and which is modified when dispensing onto said master pattern to be capable of retaining an electrical charge applied thereto, wherein said master pattern has a photo conductive layer and wherein said photo conductive layer is radiated by laser light to create the desired pattern for generation of said electrostatic forces.

20. A method for producing an electrically conductive pattern on an electrically non-conductive surface layer comprising dispensing a powder material onto a master pattern, generating electrostatic forces between said surface layer and said master pattern to transfer said powder material from said master pattern directly onto said surface layer so as to duplicate the master pattern on the surface layer and fixing said material on said surface layer, said powder material consisting of a conductive material which when fixed onto said surface, forms a suitable electrical conductor, and which is modified when dispensing onto said master pattern to be capable of retaining an electrical charge applied thereto, wherein said master pattern comprises a carrier of an electrically conductive material having on a surface thereof a pattern layer of electrically non-conductive material on which an electrostatic charge can be induced and wherein said pattern layer is formed on said carrier by radiation thereof with a laser.

* * * * *